(12) United States Patent
Markov et al.

(10) Patent No.: US 8,488,388 B2
(45) Date of Patent: Jul. 16, 2013

(54) METHOD OF PROGRAMMING A SPLIT GATE NON-VOLATILE FLOATING GATE MEMORY CELL HAVING A SEPARATE ERASE GATE

(75) Inventors: Viktor Markov, Sunnyvale, CA (US); Jong-Won Yoo, Cupertino, CA (US); Hung Quoc Nguyen, Fremont, CA (US); Alexander Kotov, Sunnyvale, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 101 days.

(21) Appl. No.: 13/286,933

(22) Filed: Nov. 1, 2011

(65) Prior Publication Data

US 2013/0107631 A1    May 2, 2013

(51) Int. Cl.
G11C 16/04 (2006.01)
H01L 29/788 (2006.01)

(52) U.S. Cl.
USPC ............ 365/185.28; 365/185.14; 365/185.15; 365/185.18; 257/319; 257/320; 257/E29.129

(58) Field of Classification Search
USPC .................................................. 365/185.28
See application file for complete search history.

(56) References Cited

U.S. PATENT DOCUMENTS

| 4,099,196 A * | 7/1978 | Simko ...................... 365/185.18 |
| 5,091,882 A * | 2/1992 | Naruke .................... 365/185.15 |
| 6,476,440 B1 * | 11/2002 | Shin ........................... 257/320 |
| 6,747,310 B2 * | 6/2004 | Fan et al. .................... 257/320 |
| 7,598,561 B2 * | 10/2009 | Chen et al. .................. 257/315 |
| 7,800,159 B2 * | 9/2010 | Widjaja et al. .............. 257/316 |
| 7,868,375 B2 | 1/2011 | Liu et al. |
| 8,018,773 B2 * | 9/2011 | Tran et al. ................. 365/185.2 |
| 2003/0218920 A1 | 11/2003 | Harari |
| 2007/0291545 A1 | 12/2007 | Moklesi |
| 2008/0291737 A1 | 11/2008 | Moon et al. |

OTHER PUBLICATIONS

Yao, et al., "Method for Endurance Optimiztion of the HIMOS™ Flash Memory Cell," IEEE 43rd Annual International Reliability Physics Symposium, San Jose, 2005, pp. 662-663.
PCT International Search Report of PCT/US12/59623; dated Dec. 10, 2012.
PCT Written Opinion of the International Searching Authority of PCT/US12/59623; dated Dec. 10, 2012.

* cited by examiner

*Primary Examiner* — Son Mai
(74) *Attorney, Agent, or Firm* — DLA Piper LLP (US)

(57) ABSTRACT

A non-volatile memory cell includes first and second regions and a channel region therebetween, a word line gate over a first portion of the channel region, a floating gate over another portion of the channel region and adjacent to the word line gate, a coupling gate over the floating gate, and an erase gate adjacent to the floating gate on an opposite side to the word line gate and over the second region. Programming the memory cell includes applying a first positive voltage to the word line gate, applying a voltage differential between the first and second regions, applying a second positive voltage to the coupling gate (where the voltages and the voltage differential are applied substantially at the same time), and applying a third positive voltage to the erase gate after a period of delay from the application of the first and second positive voltages and the voltage differential.

7 Claims, 2 Drawing Sheets

METHOD OF PROGRAMMING A SPLIT GATE NON-VOLATILE FLOATING GATE MEMORY CELL HAVING A SEPARATE ERASE GATE

TECHNICAL FIELD

The present invention relates to a method of programming a non-volatile memory cell having a floating gate and more particularly to a method of programming a split gate non-volatile memory cell having a separate erase gate.

BACKGROUND OF THE INVENTION

Non-volatile memory cells having a floating gate for the storage of charges thereon are well known in the art. Referring to FIG. 1 there is shown a cross-sectional view of a non-volatile memory cell 10 of the prior art. The memory cell 10 comprises a single crystalline substrate 12, of a first conductivity type, such as P type. At or near a surface of the substrate 12 is a first region 14 of a second conductivity type, such as N type. Spaced apart from the first region 14 is a second region 16 also of the second conductivity type. Between the first region 14 and the second region 16 is a channel region 18. A word line 20, made of polysilicon is positioned over a first portion of the channel region 18. The word line 20 is spaced apart from the channel region 18 by an insulating layer 22, such as silicon (di)oxide. Immediately adjacent to and spaced apart from the word line 20 is a floating gate 24, which is also made of polysilicon, and is positioned over another portion of the channel region 18. The floating gate 24 is separated from the channel region 18 by another insulating layer 30, typically also of silicon (di)oxide. A coupling gate 26, also made of polysilicon is positioned over the floating gate 24 and is insulated therefrom by another insulating layer 32. On another side of the floating gate 24, and spaced apart therefrom, is an erase gate 28, also made of polysilicon. The erase gate 28 is positioned over the second region 16 and is insulated therefrom. The erase gate 28 is adjacent to and spaced apart from the coupling gate 26. The erase gate 28 can have a slight overhang over the floating gate 24. In the operation of the memory cell 10, charge stored on the floating gate 24 controls the flow of current between the first region 14 and the second region 16. Where the floating gate 24 is negatively charged thereon, the memory cell is programmed. Where the floating gate 24 is positively charged thereon, the memory cell is erased. The memory cell 10 is fully disclosed in U.S. Pat. No. 7,868,375 whose disclosure is incorporated herein in its entirety by reference.

The memory cell 10 operates as follows. During the programming operation, when electrons are injected to the floating gate 24 through hot-electron injection with the portion of the channel 18 under the floating gate 24 in inversion, a first positive voltage in the shape of a pulse is applied to the word line 20 causing the portion of the channel region 18 under the word line 20 to be conductive. A second positive voltage, also in the shape of a pulse, is applied to the coupling gate 26, to utilize high coupling ratio between coupling gate 26 and floating gate 24 to maximize the voltage coupling to the floating gate 24. A third positive voltage, also in the shape of a pulse, is applied to the erase gate 28, to utilize coupling ratio between erase gate 28 and floating gate 24 to maximize the voltage coupling to the floating gate 24. A voltage differential, also in the shape of a pulse, is applied between the first region 14 and the second region 16, to provide generation of hot electrons in the channel 18. All of the first positive voltage, second positive voltage, third positive voltage and the voltage differential are applied substantially at the same time, and terminate substantially at the same time. During programming operation the potential on the floating gate 24 monotonically reduces from a highest value at the beginning of programming operation to a lowest value at the end of programming operation.

During the erase operation, when electrons are removed from the floating gate 24, a high positive voltage is applied to the erase gate 28. A negative voltage or ground voltage can be applied to the coupling gate 26 and/or the word line 20. Electrons are transferred from the floating gate 24 to the erase gate 28 by Fowler-Nordheim tunneling through the insulating layer between the floating gate 24 and the erase gate 28. In particular, the floating gate 24 may be formed with a sharp tip facing the erase gate 28, thereby facilitating said tunneling of electrons.

During the read operation, a first positive voltage is applied to the word line 20 to turn on the portion of the channel region 18 beneath the word line 20. A second positive voltage is applied to the coupling gate 26. A voltage differential is applied to the first region 14 and the second region 16. If the floating gate 24 were programmed, i.e. the floating gate 24 stores electrons, then the second positive voltage applied to the coupling gate 26 is not able to overcome the negative electrons stored on the floating gate 24 and the portion of the channel region 18 beneath the floating gate 24 remains non-conductive. Thus, no current or a negligibly small amount of current would flow between the first region 14 and the second region 16. However, if the floating gate 24 were not programmed, i.e. the floating gate 24 remains neutral or positively charged, then the second positive voltage applied to the coupling gate 26 is able to cause the portion of the channel region 18 beneath the floating gate 24 to be conductive. Thus, a current would flow between the first region 14 and the second region 16.

As is well known, memory cells 10 are typically formed in an array, having a plurality of rows and columns of memory cells 10, on a semiconductor wafer. One of the uses for an array of floating gate non-volatile memory cells is as a smart card. However, in such application, the array of non-volatile memory cells must have high program/erase endurance. In the prior art, during programming a high voltage has been applied to the coupling gate 26 and erase gate 28 in order to induce sufficient potential on the floating gate 24 to cause hot electrons to be injected from the channel region 18 to the floating gate 24. However, the maximum potential induced on the floating gate 24 at the beginning of programming operation can cause relatively fast degradation of the insulating layer 30 between the floating gate 24 and the channel region 18 as well as the interface between the channel region 18 and the insulating layer 30. The degradation of these areas is a major factor which affects program/erase endurance of a memory cell.

The prior art also discloses applying a ramped voltage to the coupling gate 26 of a memory cell having a word line gate 20 and a coupling gate 26 (but without an erase gate) during programming to increase the endurance of the memory cell. See "Method For Endurance Optimization of The HIMOS Flash Memory Cell" by Yao et al, IEEE 43rd Annual International Reliability Physics Symposium, San Jose, 2005, pp. 662-663.

The memory cell 10 does not require a high voltage to be applied to the second region 16 to cause programming, which enables high program/erase endurance. Nevertheless, the prior art method of programming has not been optimized for high program/erase endurance. Hence, one object of the present invention is to optimize the parameters for programming the memory cell of the type shown in FIG. 1 so that endurance is further increased.

SUMMARY OF THE INVENTION

The present invention is a method of programming a non-volatile memory cell of the type with a single crystalline substrate of a first conductivity type and having a top surface. A first region of a second conductivity type is in the substrate along the top surface. A second region of the second conductivity type is in the substrate along the top surface, spaced apart from the first region, with a channel region between the first region and the second region. A word line gate is positioned over a first portion of the channel region, spaced apart from the channel region by a first insulating layer. A floating gate is positioned over another portion of the channel region, adjacent to and separated from the word line gate. The floating gate is separated from the channel region by a second insulating layer. A coupling gate is positioned over the floating gate and is insulated therefrom by a third insulating layer. An erase gate is positioned adjacent to the floating gate and is on a side opposite to the word line gate. The erase gate is positioned over the second region and is insulated therefrom. In the programming method a first positive voltage is applied to the word line gate to turn on the portion of the channel region beneath the word line gate. A voltage differential is applied between the first region and the second region, substantially at the same time as the first positive voltage, to provide generation of hot electrons in the channel. A second positive voltage is applied to the coupling gate, substantially at the same time as the first positive voltage, to provide hot electron injection from the channel to the floating gate. A third positive voltage is applied to the erase gate gate. The third positive voltage is applied after a period of delay after the start of the first and second positive voltages and voltage differential between the first region and the second region, to reduce the maximum potential of the floating gate during programming operation and, therefore, to improve program/erase endurance of the memory cell.

DETAILED DESCRIPTION OF THE PREFERRED EMBODIMENT

Figure 1:
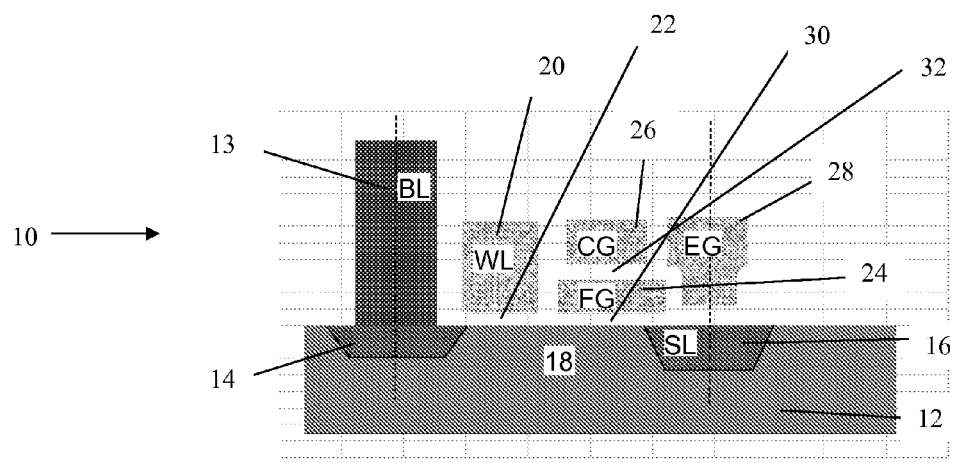
FIG. 1 is a cross-sectional view of a non-volatile memory cell of the prior art with a floating gate for the storage of charges thereon to which the programming method of the present invention is applicable.
Figure 2:
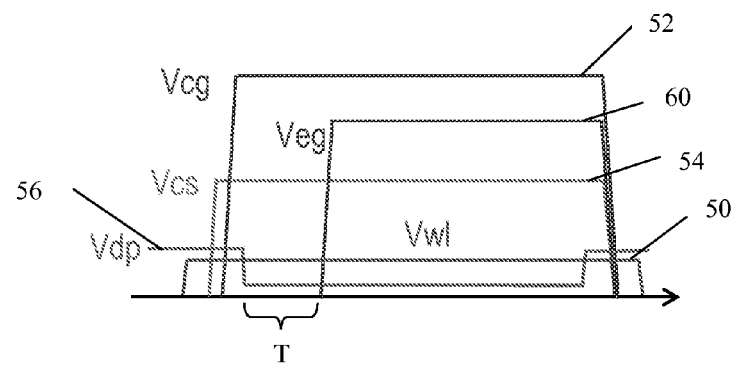
FIG. 2 are graphs showing the various waveforms for the voltages used in programming the memory cell of FIG. 1 in the method of the present invention.

Referring to FIG. 2 there is shown a graph of the various waveforms, used in the method of the present invention to program the memory cell 10 shown in FIG. 1. In the method of the present invention, a first positive voltage, substantially of a pulse form shape 50 is applied to the word line gate 20. The pulse applied to the word line gate 20 is identified as the pulse Vwl in FIG. 2. A second positive voltage, substantially of a pulse form shape 52 is applied to the coupling gate 26. The pulse applied to the coupling gate 26 is identified as the pulse Vcg in FIG. 2. The pulse Vwl and Vcg are applied substantially at the same time, and end substantially at the same time. A voltage differential comprising of a voltage Vcs 54 which is applied to the second region 16 and a voltage Vdp 56 which is applied to the first region 14 are also substantially of pulse shape form and are also applied substantially at the same time as the pulses Vwl and Vcg. A third positive voltage, substantially of a pulse form shape 60 is applied to the erase gate 28. The pulse applied to the erase gate 28 is identified as the pulse Veg in FIG. 2. The pulse Veg is applied after a period of delay T after the start of the pulses Vwl and Vcg, but with the pulse Veg terminating substantially at the same time as the pulses Vwl and Veg.

In the method of programming of the present invention, a first positive voltage is applied to the word line gate to turn on the portion of the channel region beneath the word line gate. A voltage differential is applied between the first region and the second region, substantially at the same time as the first positive voltage, to provide generation of hot electrons in the channel. A second positive voltage is applied to the coupling gate, substantially at the same time as the first positive voltage, to induce high potential to floating gate and, therefore, to cause hot electrons to be injected to the floating gate from the channel region. A third positive voltage is applied to the erase gate, to provide additional voltage to attract electrons to be injected to the floating gate. A third positive voltage is applied after a period of delay from the application of the first positive voltage, the second positive voltage and the voltage differential between the first region and the second region, to improve program/erase endurance of the memory cell.

In the prior art when the pulse Vcg, the pulse Vwl, and the pulse Veg are all applied substantially at the same time, the voltage experience by the floating gate 24 is at the highest peak, and the insulating layer 30 between the floating gate 24 and the channel region 18 is stressed at the maximum. This reduces the endurance of the memory cell 10.

In the present invention, by delaying the application of the Veg, the maximum floating gate potential during the programming operation is reduced, thereby reducing degradation of the insulating layer 30 between the floating gate 24 and the channel region 18 as well as the interface between the channel region 18 and the insulating layer 30 and, therefore, increasing the endurance of the memory cell 10.

Figure 3:
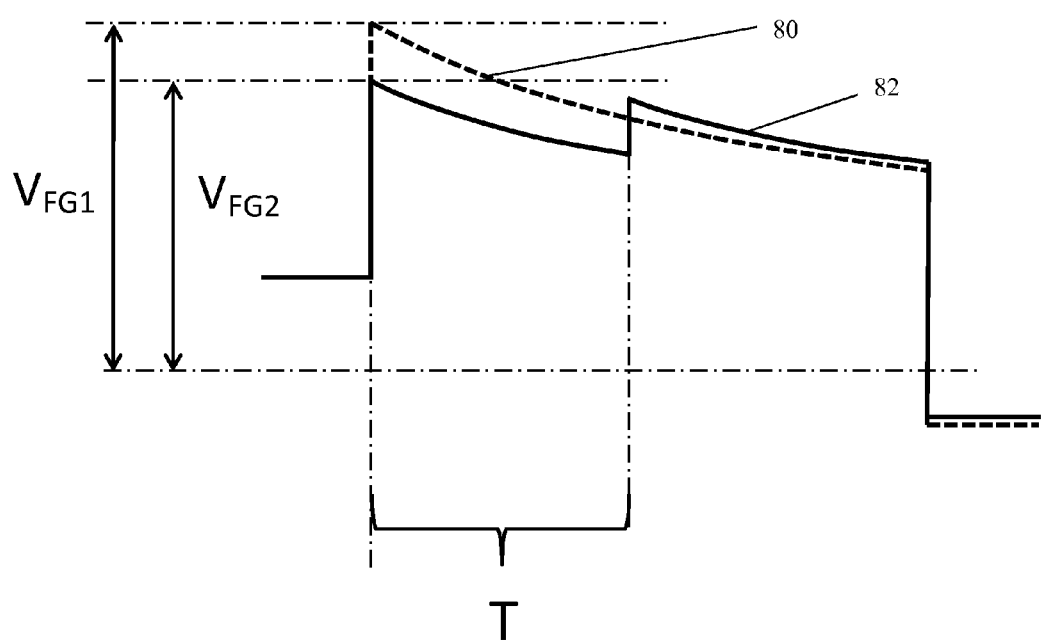
FIG. 3 are graphs showing the voltage potential on the floating gate as a result of the prior art method wherein the voltage pulses to the erase gate and the control gate are applied substantially simultaneously, and as a result of the present method when they are not applied simultaneously.

Referring to FIG. 3 there is a shown a graph 80 of the voltage on the floating gate 24 as a result of the voltage pulses to the erase gate 28 and the control gate 26 being applied substantially simultaneously, as in the method of the prior art, as well as a graph 82 of the voltage on the floating gate 24 as a result of the voltage pulses to the erase gate 28 being applied after a period of delay from the voltage applied to the control gate 26. Because of the delay in the application in the voltage to the erase gate 28 occurring after a period of delay T, the peak voltage Vfg2 as in the method of the invention is lower than the peak voltage Vfg1 as in the method of the prior art. As a result, degradation of the insulating layer 30 between the floating gate 24 and the channel region 18 as well as the interface between the channel region 18 and the insulating layer 30 is reduced.

What is claimed is:

1. A method of programming a non-volatile memory cell having a single crystalline substrate of a first conductivity type and having a top surface, with a first region of a second conductivity type in said substrate along the top surface, and a second region of the second conductivity type, in said substrate along the top surface, spaced apart from the first region, with a channel region between the first region and the second region; a word line gate is positioned over a first portion of the channel region, spaced apart from the channel region by a first insulating layer; a floating gate is positioned over another portion of the channel region, adjacent to and separated from the word line gate, wherein the floating gate is separated from the channel region by a second insulating layer; a coupling gate is positioned over the floating gate and insulated therefrom by a third insulating layer; and an erase gate is positioned adjacent to the floating gate and on a side opposite to the word line gate; said erase gate positioned over the second region and is insulated therefrom; said method comprising:

applying a first positive voltage to the word line gate to turn on the portion of the channel region beneath the word line gate;

applying a voltage differential between the first region and the second region;

applying a second positive voltage to the coupling gate, substantially at the same time as the first positive voltage, to cause hot electrons to be injected to the floating gate from the channel region;

applying a third positive voltage to the erase gate after a period of delay after the start of the first and second positive voltages and a voltage differential between the first region and the second region, to cause electrons to be injected to the floating gate.

2. The method of claim 1 wherein said first, second and third positive voltages terminate at substantially the same time.

3. The method of claim 1 wherein said voltage differential between the first region and the second region is applied at substantially the same time as the first and second positive voltages.

4. The method of claim 1 wherein each of said first, second and third voltages is a pulse shaped signal, and wherein said third voltage is a delayed pulse signal.

5. The method of claim 4 wherein said first, second and third positive voltages terminate at substantially the same time.

6. The method of claim 1 whereby the period of delay is long enough to reduce the maximum potential on the floating gate during the programming operation.

7. The method of claim 1 wherein said erase gate has an overhang over the floating gate.

* * * * *